(12) United States Patent
Qiu et al.

(10) Patent No.: US 10,663,782 B2
(45) Date of Patent: May 26, 2020

(54) LIQUID CRYSTAL PANEL AND THIN FILM TRANSISTOR ARRAY SUBSTRATE THEREOF

(71) Applicant: Wuhan China Star Optoelectronics Technology Co., Ltd., Wuhan, Hubei (CN)

(72) Inventors: Xin Qiu, Guangdong (CN); Yao-li Huang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 16/244,241

(22) Filed: Jan. 10, 2019

(65) Prior Publication Data
US 2019/0146262 A1   May 16, 2019

Related U.S. Application Data

(63) Continuation of application No. 15/327,996, filed on Jan. 20, 2017, now Pat. No. 10,191,313.

(51) Int. Cl.
*G02F 1/1345*   (2006.01)
*G02F 1/1333*   (2006.01)
(Continued)

(52) U.S. Cl.
CPC ........ *G02F 1/133305* (2013.01); *G02F 1/133* (2013.01); *G02F 1/1362* (2013.01); *G02F 1/13452* (2013.01); *G02F 1/13454* (2013.01); *G02F 1/133514* (2013.01); *G02F 1/136204* (2013.01); *H01L 27/1214* (2013.01);
(Continued)

(58) Field of Classification Search
CPC .. G02F 1/133; G02F 1/1333; G02F 1/133305; G02F 1/133308; G02F 1/133514; G02F 1/1345; G02F 1/13454; G02F 1/1362; G02F 1/136204; G02F 1/13452; G02F 1/136; G02F 1/1368; G02F 2001/133311; G02F 2001/13456; G02F 2201/50; G02F 2202/22; G02F 2202/28;
(Continued)

(56) References Cited

U.S. PATENT DOCUMENTS 6,309,902 B1 * 10/2001 Muramatsu ............. H01L 21/56
257/E21.502
2003/0151791 A1 * 8/2003 Otagiri .............. G02F 1/133371
359/245

(Continued)

*Primary Examiner* — Thoi V Duong
(74) *Attorney, Agent, or Firm* — Andrew C. Cheng

(57) ABSTRACT

A thin film transistor (TFT) array substrate includes: a substrate; a display region formed on the substrate; a flexible printed circuit disposed on the substrate and located at one side of the display region; a control chip disposed between the display region and the flexible printed circuit, and two sides of the flexible printed circuit going beyond two corresponding sides of the control chip, respectively; a first reinforcement member disposed at a first side of the control chip, and the first side being adjacent to one side of the control chip that faces the display region; a second reinforcement member disposed at a second side of the control chip opposite to the first side; and a third reinforcement member covering the control chip, the first reinforcement member and the second reinforcement member.

17 Claims, 2 Drawing Sheets

(51) Int. Cl.
*H01L 27/12* (2006.01)
*G02F 1/1362* (2006.01)
*G02F 1/1335* (2006.01)
*G02F 1/133* (2006.01)

(52) U.S. Cl.
CPC ...... *H01L 27/1218* (2013.01); *H01L 27/1262* (2013.01); *G02F 2001/13456* (2013.01); *G02F 2001/133311* (2013.01); *G02F 2201/50* (2013.01); *G02F 2202/22* (2013.01); *G02F 2202/28* (2013.01)

(58) Field of Classification Search
CPC ............. H01L 27/1214; H01L 27/1218; H01L 27/1262; H01L 51/5253
See application file for complete search history.

(56) References Cited

U.S. PATENT DOCUMENTS

2007/0013822 A1\* 1/2007 Kawata ............... G02F 1/13452
349/41
2008/0246744 A1\* 10/2008 Park ...................... G06F 3/0416
345/173

\* cited by examiner

LIQUID CRYSTAL PANEL AND THIN FILM TRANSISTOR ARRAY SUBSTRATE THEREOF

CROSS REFERENCE TO RELATED APPLICATIONS

This is a continuation application of co-pending patent application Ser. No. 15/327,996, filed on Jan. 20, 2017, which is a national stage of PCT Application Number PCT/CN2016/089973, filed on Jul. 14, 2016, claiming foreign priority of Chinese Patent Application Number 201610349589.4, filed on May 24, 2016.

TECHNICAL FIELD

The present invention belongs to a technical field of a liquid crystal display, in particular, relates to a liquid crystal panel and a thin film transistor array substrate thereof.

BACKGROUND ART

A gradual progress of photoelectric and semiconductor technology drives a flourish of a flat panel display, while in various flat panel displays, a liquid crystal display (LCD) has been applied to various aspects in a product life due to its superior characteristics such as high space utility efficiency, low power consumption, radiation-free and low electromagnetic interference etc.

The existing liquid crystal displays are mostly backlight liquid crystal displays, which include a liquid crystal panel and a backlight module. A working principle of the liquid crystal panel is placing liquid crystal molecules between two parallel glass substrates, there are a plurality of vertical and horizontal thin wires between the two glass substrates, and a direction change of the liquid crystal molecule is controlled by power on or not, to refract light rays of the backlight module to generate a picture.

Generally, the liquid crystal panel is composed of a color filter (CF) substrate, a thin film transistor (TFT) array substrate, a liquid crystal (LC) interposed between the CF substrate and the TFT array substrate, and a sealant.

At present, a display driving chip (or called a control chip) on the TFT array substrate usually uses a manner of a chip on glass (COG) substrate to perform a mounting. Advantages of using the above manner lie in: reducing welding process, having a greatly reduced volume with respect to a manner of a chip on board (COB), easier for miniaturization, facilitation and high integration, and there being not problems such as chip deformation etc.

However, a length of the display driving chip is smaller than a width of a region (i.e., a display region) occupied by the TFT, so that the area occupied by the display driving chip becomes a region in which strength is weakest in the whole TFT array substrate. Meanwhile, the display driving chip is directly mounted on the TFT array substrate, causing that there is no space of making static electricity protection measures between the display driving chip and the display region. The above two problems will reduce yield rate of the liquid crystal panel.

SUMMARY

In order to solve the problem existing in the prior art, a purpose of the present invention is to provide a thin film transistor (TFT) array substrate which includes: a substrate; a plurality of thin film transistors (TFTs) arranged on the substrate in an array form, wherein a region occupied by the plurality of TFTs is a display region; a flexible printed circuit disposed on the substrate and located at one side of the display region; a control chip disposed between the display region and the flexible printed circuit, and two sides of the flexible printed circuit going beyond two corresponding sides of the control chip, respectively; a first reinforcement member disposed at a first side of the control chip, and the first side being adjacent to one side of the control chip that faces the display region; a second reinforcement member disposed at a second side of the control chip opposite to the first side; and a third reinforcement member covering the control chip, the first reinforcement member and the second reinforcement member.

Further, upper surfaces of the first reinforcement member and the second reinforcement member are aligned with an upper surface of the control chip.

Further, both the first reinforcement member and the second reinforcement member include: a reinforcement body, a first glue receiving groove formed by one side of the reinforcement body that faces the display region being recessed, and a second glue receiving groove formed by a connection of one side of the reinforcement body that faces the control chip with one side of the reinforcement body that is opposite to the display region being recessed.

Further, end portions of the flexible printed circuit that go beyond sides of the control chip are engaged in the second glue receiving groove.

Further, the third reinforcement member includes: a reinforcement body, and two third glue receiving grooves formed by two ends of the reinforcement body that face one side of the display region being recessed respectively.

Further, the third glue receiving groove corresponds to the first glue receiving groove up and down.

Further, glues are spilled into the first glue receiving groove, the second glue receiving groove and the third glue receiving groove, so as to fix the first reinforcement member, the second reinforcement member and the third reinforcement member.

Further, the TFT array substrate further includes: a conductive tape disposed on the third reinforcement member; one end of the conductive tape extending to a region between the display region and the control chip, to electrically connect the control chip; and the other end of the conductive tape extending to the flexible printed circuit, to electrically connect a ground terminal on the flexible printed circuit.

Further, the first reinforcement member, the second reinforcement member and the third reinforcement member are all made of polyethylene terephthalate (PET).

Another purpose of the present invention is further to provide a liquid crystal panel which includes the above TFT array substrate.

Advantageous effects of the present invention are as follows: the present invention disposes reinforcement members around the control chip, to enhance strength of the area occupied by the control chip, and connects the control chip and a ground point on the flexible printed circuit through the conductive tape disposed on the third reinforcement member. Thus, an interference to the control chip from an ambient environment can be shielded efficiently, and meanwhile, static electricity can flow to the ground point of the flexible printed board from the conductive tape directly, so as to avoid static damage for the control chip caused by the static electricity.

BRIEF DESCRIPTION OF THE DRAWINGS

The above and/or other aspects, characteristics and advantages of the embodiments of the present invention will become apparent from the following description, taken in conjunction with the accompanying drawings in which.

DETAILED DESCRIPTION OF EXEMPLARY EMBODIMENTS

Figure 1:
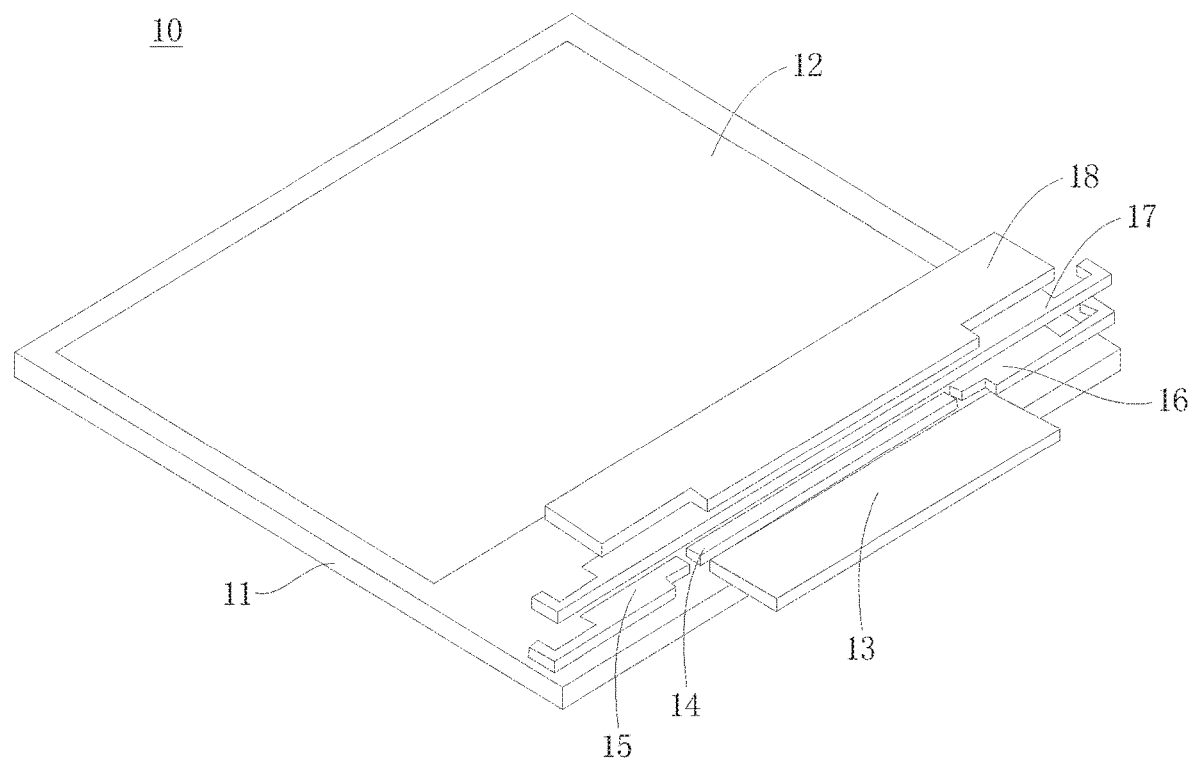
FIG. 1 is a stereo exploded view of a thin film transistor (TFT) array substrate according to an embodiment of the present invention.

Embodiments of the present invention will be described in detail below by referring to the accompany drawings. However, the present disclosure can be implemented in numerous different forms, and the present disclosure should not be explained to be limited to the particular embodiments set forth herein. Instead, these embodiments are provided for explaining the principle and actual application of the present disclosure, and thus other skilled in the art can understand various embodiments and amendments which are suitable for specific intended applications of the present disclosure.

In the drawings, to be clear, thicknesses of a layer and a region may be exaggerated. The same reference numerals denote the same components in the drawings throughout.

It will be understood that, even though terms of "first", "second", etc. here can be used to describe various components, these components should not be limited by these terms. The terms are only used to distinguish one component from another component.

FIG. 1 is a stereo exploded view of a thin film transistor (TFT) array substrate according to an embodiment of the present invention.

Referring to FIG. 1, a thin film transistor (TFT) array substrate 10 according to an embodiment of the present invention includes: a substrate 11; a display region 12 formed on the substrate 11, wherein the display region 12 is formed by a region occupied by a plurality of thin film transistors (TFTs) (not shown) that are arranged on the substrate 11 in an array form; a flexible printed circuit (FPC) 13 disposed on the substrate 11 and located at one side of the display region 12; a control chip (or called a display driving chip) 14 disposed on the substrate 11 and located between the display region 12 and the FPC 13, wherein two sides of the FPC 13 go beyond two corresponding sides of the control chip 14, respectively; a first reinforcement member 15 disposed at a first side of the control chip 14, wherein the first side of the control chip 14 is adjacent to one side of the control chip 14 that faces the display region 12; a second reinforcement member 16 disposed at a second side of the control chip 14, wherein the second side of the control chip 14 is opposite to the first side thereof; and a third reinforcement member 17 covering the control chip 14, the first reinforcement member 15 and the second reinforcement member 16. Hence, strength of the area occupied by the control chip 14 is enhanced by disposing reinforcement members around the control chip 14.

Further, the TFT array substrate 10 according to the embodiment of the present invention further includes: a conductive tape 18 disposed on the third reinforcement member 17. The conductive tape 18 is used to connect the control chip 14 and a ground point on the FPC 13. Thus, interference to the control chip 14 from an ambient environment can be shielded efficiently, and meanwhile, static electricity can flow to the ground point of the FPC 13 from the conductive tape 18 directly, so as to avoid static damage for the control chip 14 caused by the static electricity.

Figure 2:
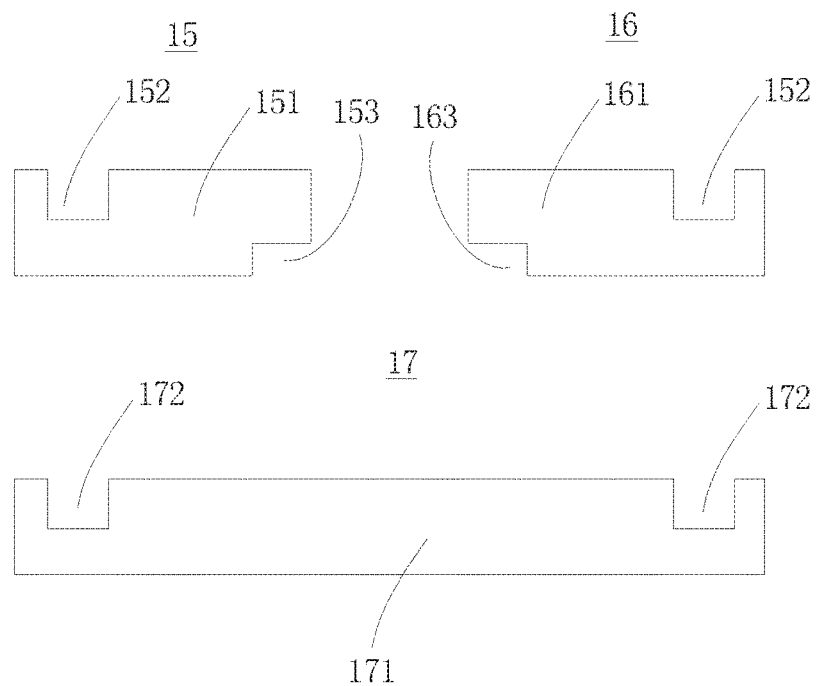
FIG. 2 is a structural schematic view of a first reinforcement member, a second reinforcement member and a third reinforcement member according to an embodiment of the present invention.

FIG. 2 is a structural schematic view of a first reinforcement member, a second reinforcement member and a third reinforcement member according to an embodiment of the present invention.

Referring to FIGS. 1 and 2, the first reinforcement member 15 according to the embodiment of the present invention includes: a first reinforcement body 151, a first glue receiving groove 152 formed by one side of the first reinforcement body 151 that faces the display region 12 being recessed, and a second glue receiving groove 153 formed by a connection of one side of the first reinforcement body 151 that faces the control chip 14 with one side of the first reinforcement body 151 that is opposite to the display region 12 being recessed.

Similarly, the second reinforcement member 16 according to the embodiment of the present invention includes: a second reinforcement body 161, a third glue receiving groove 162 formed by one side of the second reinforcement body 161 that faces the display region 12 being recessed, and a fourth glue receiving groove 163 formed by a connection of one side of the second reinforcement body 161 that faces the control chip 14 with one side of the second reinforcement body 161 that is opposite to the display region 12 being recessed.

The third reinforcement member 17 according to the embodiment of the present invention includes: a third reinforcement body 171, and two fifth glue receiving grooves 172 formed by two ends of the third reinforcement body 171 that face one side of the display region 12 being recessed respectively.

When the third reinforcement member 17 covers the control chip 14, the first reinforcement member 15 and the second reinforcement member 16, one of the two fifth glue receiving grooves 172 is overlapped and aligned with the first glue receiving groove 152 up and down, and the other one of the two fifth glue receiving grooves 172 is overlapped and aligned with the third glue receiving groove 162 up and down.

When the first reinforcement member 15, the second reinforcement member 16 and the third reinforcement member 17 are fixed, two sides of the control chip 14 may be coated with glues having a certain length and thickness, and then the first reinforcement member 15, the second reinforcement member 16 are bonded to the two sides of the control chip 14 respectively, and the third reinforcement member 17 is covered on the control chip 14, the first reinforcement member 15 and the second reinforcement member 16. In the pressing process, the glues are spilled into the respective glue receiving grooves, so as to complete fixing the first reinforcement member 15, the second reinforcement member 16 and the third reinforcement member 17. Please refer to FIGS. 3 and 4 for details.

Figure 3:
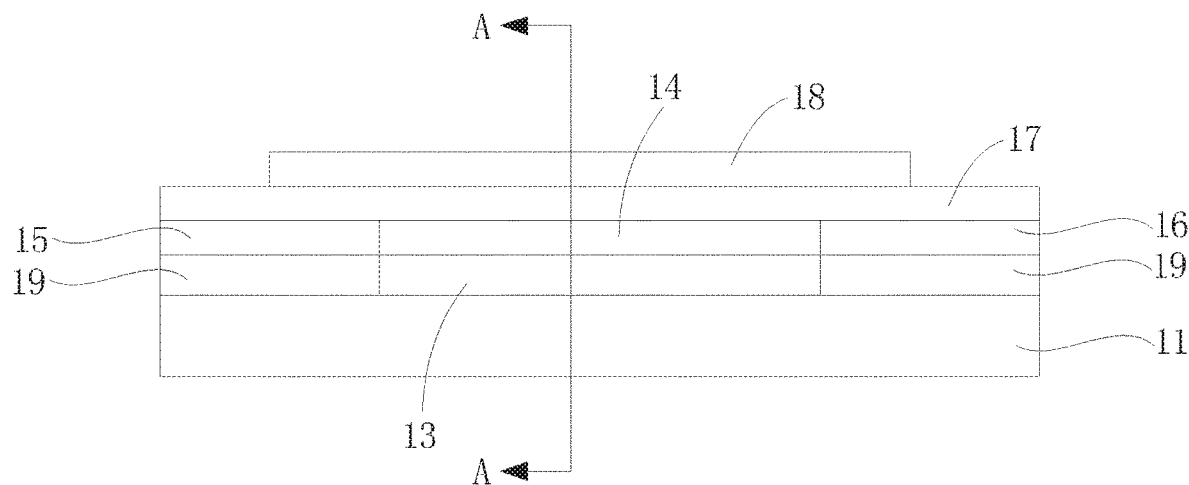
FIG. 3 is a side view of a liquid crystal panel according to an embodiment of the present invention.
Figure 4:
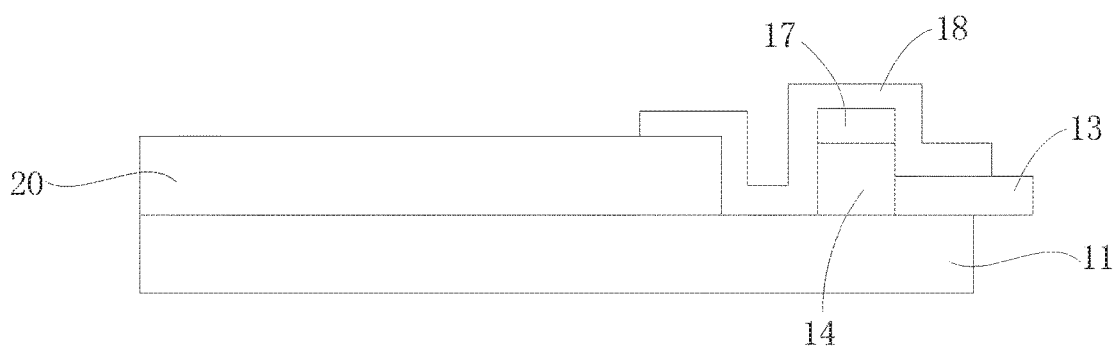
FIG. 4 is an A-A reference arrow view in FIG. 3.

FIG. 3 is a side view of a liquid crystal panel according to an embodiment of the present invention. FIG. 4 is an A-A reference arrow view in FIG. 3.

Referring to FIGS. 3 and 4, the liquid crystal panel according to the embodiment of the present invention includes: a thin film transistor (TFT) array substrate 10; a color filter (CF) substrate 20 disposed by combining with the TFT array substrate 10; and a liquid crystal layer (not shown) interposed there-between.

An area of the CF substrate 12 substantially corresponds to an area of the display region 12 of the TFT array substrate 10. In general, the CF substrate 12 includes necessary parts such as a color resist, a black matrix, and an alignment film layer and so on.

The first reinforcement member 15 and the second reinforcement member 16 are bonded to two sides of the control chip 14 through glues 19, respectively. Further, the first reinforcement member 15 and the second reinforcement member 16 are raised through the glues 19 between the first reinforcement member 15 and the substrate 11 and between the second reinforcement member 16 and the substrate 11, so as to align both upper surfaces of the first reinforcement member 15 and the second reinforcement member 16 with the upper surface of the control chip 14, thereby disposing the third reinforcement member 17 conveniently.

When the first reinforcement member 15 and the second reinforcement member 16 are bonded to two sides of the control chip 14 through the glues 19, respectively, the second glue receiving groove 153 and the fourth glue receiving groove 163 are engaged with end portions of the FPC 13 that go beyond sides of the control chip 14, respectively.

The conductive tape 18 is disposed on the third reinforcement member 17. On end of the conductive tape 18 extends to a region between the display region 12 and the control chip 14 and extends to the CF substrate 12, to electrically connect the control chip 14; and the other end of the conductive tape 18 extends to the FPC 13, to electrically connect a ground point on the FPC 13.

In addition, in the present embodiment, the first reinforcement member 15, the second reinforcement member 16 and the third reinforcement member 17 are all made of polyethylene terephthalate (PET), while the present invention is not limited thereto.

Although the present invention is described with reference to the special embodiments, it will be understood by those skilled in the art that various changes in form and details may be made therein without departing from the spirit and scope of the invention as defined by the appended claims and its equivalents.

The invention claimed is:

1. A thin film transistor (TFT) array substrate, comprising:
a substrate;
a plurality of thin film transistors (TFTs) arranged on the substrate in an array form, wherein a region occupied by the plurality of TFTs is a display region;
a flexible printed circuit disposed on the substrate and located at one side of the display region;
a control chip disposed between the display region and the flexible printed circuit, and two sides of the flexible printed circuit going beyond two corresponding sides of the control chip, respectively;
a first reinforcement member disposed at a first side of the control chip, and the first side being adjacent to one side of the control chip that faces the display region;
a second reinforcement member disposed at a second side of the control chip opposite to the first side; and
a third reinforcement member covering the control chip, the first reinforcement member and the second reinforcement member,
wherein the first reinforcement member and the second reinforcement member are respectively bonded to the substrate at the first and second sides of the control chip through glues applied between the first and second reinforcement members and the substrate such that the first reinforcement member and the second reinforcement member are raised by the glues that are provided between the first and second reinforcement members and the substrate so as to have upper surfaces of the first and second reinforcement members aligned with an upper surface of the control chip; and
wherein both the first reinforcement member and the second reinforcement member comprise: a reinforcement body, a first glue receiving groove formed by one side of the reinforcement body that faces the display region being recessed, and a second glue receiving groove formed by a connection of one side of the reinforcement body that faces the control chip with one side of the reinforcement body that is opposite to the display region being recessed.

2. The TFT array substrate of claim 1, wherein end portions of the flexible printed circuit that go beyond sides of the control chip are engaged in the second glue receiving groove.

3. The TFT array substrate of claim 2, wherein the third reinforcement member comprises: a reinforcement body, and two third glue receiving grooves formed by two ends of the reinforcement body that face one side of the display region being recessed respectively.

4. The TFT array substrate of claim 3, wherein the third glue receiving groove corresponds to the first glue receiving groove up and down.

5. The TFT array substrate of claim 4, wherein glues are spilled into the first glue receiving groove, the second glue receiving groove and the third glue receiving groove, so as to fix the first reinforcement member, the second reinforcement member and the third reinforcement member.

6. The TFT array substrate of claim 1, wherein the third reinforcement member comprises: a reinforcement body, and two third glue receiving grooves formed by two ends of the reinforcement body that face one side of the display region being recessed respectively.

7. The TFT array substrate of claim 6, wherein the third glue receiving groove corresponds to the first glue receiving groove up and down.

8. The TFT array substrate of claim 7, wherein glues are spilled into the first glue receiving groove, the second glue receiving groove and the third glue receiving groove, so as to fix the first reinforcement member, the second reinforcement member and the third reinforcement member.

9. The TFT array substrate of claim 1, further comprising: a conductive tape disposed on the third reinforcement member; one end of the conductive tape extending to a region between the display region and the control chip, to electrically connect the control chip; and the other end of the conductive tape extending to the flexible printed circuit, to electrically connect a ground terminal on the flexible printed circuit.

10. The TFT array substrate of claim 1, wherein the first reinforcement member, the second reinforcement member and the third reinforcement member are all made of polyethylene terephthalate (PET).

11. A liquid crystal panel, comprising a thin film transistor (TFT) array substrate and a color filter substrate coupled with each other, and a liquid crystal layer interposed between the TFT substrate and the color filter substrate, wherein the TFT array substrate comprises:
a substrate;
a plurality of thin film transistors (TFTs) arranged on the substrate in an array form, wherein a region occupied by the plurality of TFTs is a display region;
a flexible printed circuit disposed on the substrate and located at one side of the display region;
a control chip disposed between the display region and the flexible printed circuit, and two sides of the flexible printed circuit going beyond two corresponding sides of the control chip, respectively;

a first reinforcement member disposed at a first side of the control chip, and the first side being adjacent to one side of the control chip that faces the display region;

a second reinforcement member disposed at a second side of the control chip opposite to the first side; and a third reinforcement member covering the control chip, the first reinforcement member and the second reinforcement member, wherein the first reinforcement member and the second reinforcement member are respectively bonded to the substrate at the first and second sides of the control chip through glues applied between the first and second reinforcement members and the substrate such that the first reinforcement member and the second reinforcement member are raised by the glues that are provided between the first and second reinforcement members and the substrate so as to have upper surfaces of the first and second reinforcement members aligned with an upper surface of the control chip; and wherein both the first reinforcement member and the second reinforcement member comprise: a reinforcement body, a first glue receiving groove formed by one side of the reinforcement body that faces the display region being recessed, and a second glue receiving groove formed by a connection of one side of the reinforcement body that faces the control chip with one side of the reinforcement body that is opposite to the display region being recessed.

12. The liquid crystal panel of claim 11, wherein end portions of the flexible printed circuit that go beyond sides of the control chip are engaged in the second glue receiving groove.

13. The liquid crystal panel of claim 11, wherein the third reinforcement member comprises: a reinforcement body, and two third glue receiving grooves formed by two ends of the reinforcement body that face one side of the display region being recessed respectively.

14. The liquid crystal panel of claim 13, wherein the third glue receiving groove corresponds to the first glue receiving groove up and down.

15. The liquid crystal panel of claim 14, wherein glues are spilled into the first glue receiving groove, the second glue receiving groove and the third glue receiving groove, so as to fix the first reinforcement member, the second reinforcement member and the third reinforcement member.

16. The liquid crystal panel of claim 11, further comprising: a conductive tape disposed on the third reinforcement member; one end of the conductive tape extending to a region between the display region and the control chip, to electrically connect the control chip; and the other end of the conductive tape extending to the flexible printed circuit, to electrically connect a ground terminal on the flexible printed circuit.

17. The liquid crystal panel array substrate of claim 11, wherein the first reinforcement member, the second reinforcement member and the third reinforcement member are all made of polyethylene terephthalate (PET).

* * * * *